United States Patent
Jordan et al.

(10) Patent No.: US 11,725,523 B2
(45) Date of Patent: Aug. 15, 2023

(54) MICROSTRUCTURE GEOMETRY FOR THERMAL BARRIER COATINGS TO MITIGATE CMAS ATTACK

(71) Applicant: University of Connecticut, Farmington, CT (US)

(72) Inventors: Eric Jordan, Storrs, CT (US); Rishi Kumar, Ashford, CT (US)

( * ) Notice: Subject to any disclaimer, the term of this patent is extended or adjusted under 35 U.S.C. 154(b) by 232 days.

(21) Appl. No.: 17/085,105

(22) Filed: Oct. 30, 2020

(65) Prior Publication Data

US 2021/0222570 A1    Jul. 22, 2021

Related U.S. Application Data

(63) Continuation of application No. 16/435,484, filed on Jun. 8, 2019, now Pat. No. 10,822,968.

(60) Provisional application No. 62/682,635, filed on Jun. 8, 2018.

(51) Int. Cl.
*F01D 5/28* (2006.01)
*C23C 14/28* (2006.01)
*C23C 4/134* (2016.01)

(52) U.S. Cl.
CPC .............. *F01D 5/288* (2013.01); *C23C 4/134* (2016.01); *C23C 14/28* (2013.01); *F05D 2220/32* (2013.01); *F05D 2230/90* (2013.01)

(58) Field of Classification Search
CPC ......... F01D 5/288; C23C 4/134; C23C 14/28; F05D 2220/32; F05D 2230/90
USPC ....................................................... 428/167
See application file for complete search history.

(56) References Cited

U.S. PATENT DOCUMENTS

| | | | | |
|---|---|---|---|---|
| 10,472,286 B2 * | 11/2019 | Jordan | ................... | C01F 17/34 |
| 10,822,968 B2 * | 11/2020 | Jordan | ................... | C23C 14/30 |
| 2015/0017018 A1 * | 1/2015 | Lacy | ...................... | F01D 5/186 |
| | | | | 416/97 R |
| 2016/0257618 A1 * | 9/2016 | Jordan | ................... | C01F 17/34 |

OTHER PUBLICATIONS

Restriction Requirement for U.S. Appl. No. 16/534,484, dated Mar. 6, 2020, 5 pages.
Office Action for U.S. Appl. No. 16/534,484, dated May 13, 2020, 8 pages.
Notice of Allowance for U.S. Appl. No. 16/534,484, dated Jun. 25, 2020, 7 pages.

* cited by examiner

Primary Examiner — Brent T O'Hern
(74) Attorney, Agent, or Firm — Intellectual Strategies

(57) ABSTRACT

Thermal barrier coatings and methods to make such coatings present improved resistance to CMAS infiltration. The method for forming a thermal barrier coating includes applying a layer of the thermal barrier coating to a component having a surface, forming a plurality of first channels in the thermal barrier coating, and forming a plurality of second channels in the thermal barrier coating. The first channels extend through a thickness of the thermal barrier coating from an interface with the surface of the component to a free surface opposite the interface. The second channels are disposed between the free surface and the interface and extending lengthwise generally parallel to the free surface of the thermal barrier coating, wherein the thermal barrier coating comprises a material comprising yttrium aluminum garnet (YAG) or yttria stabilized zirconia (YSZ).

19 Claims, 7 Drawing Sheets

MICROSTRUCTURE GEOMETRY FOR THERMAL BARRIER COATINGS TO MITIGATE CMAS ATTACK

CROSS-REFERENCE TO RELATED APPLICATIONS

This application is a continuation of U.S. patent application Ser. No. 16/435,484 entitled "Microstructure Geometry for Thermal Barrier Coatings to Mitigate CMAS Attack" and filed on Jun. 8, 2019, which claims the benefit of U.S. Provisional Application No. 62/682,635, filed on Jun. 8, 2018, all of which are incorporated by reference herein in their entirety.

STATEMENT OF FEDERALLY SPONSORED RESEARCH

This invention was made with Government support under DE-SC0007544 awarded by Department of Energy. The Government has certain rights to this invention.

SUMMARY

Embodiments of methods and apparatuses are described to make thermal barrier coatings and with improved resistance to CMAS infiltration.

In one embodiment, thermal barrier coatings and methods for forming such coatings present improved resistance to CMAS infiltration. The method for forming a thermal barrier coating includes applying a layer of the thermal barrier coating to a component having a surface, forming a plurality of first channels in the thermal barrier coating, and forming a plurality of second channels in the thermal barrier coating. The first channels extend through a thickness of the thermal barrier coating from an interface with the surface of the component to a free surface opposite the interface. The second channels are disposed between the free surface and the interface and extending lengthwise generally parallel to the free surface of the thermal barrier coating. Other embodiments of the method are also described.

In one embodiment, the apparatus includes a component and a thermal barrier coating. The component has a surface. The thermal barrier coating is disposed on the surface of the components. The thermal barrier coating has a thickness between an interface with the surface of the component and a free surface opposite the interface. The thermal barrier coating includes a plurality of first channels extending through the thickness of the thermal barrier coating from the interface to the free surface. The thermal barrier coating also includes a plurality of second channels disposed between the free surface and the interface and extending lengthwise generally parallel to the free surface of the thermal barrier coating. Other embodiments of the apparatus are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1A:
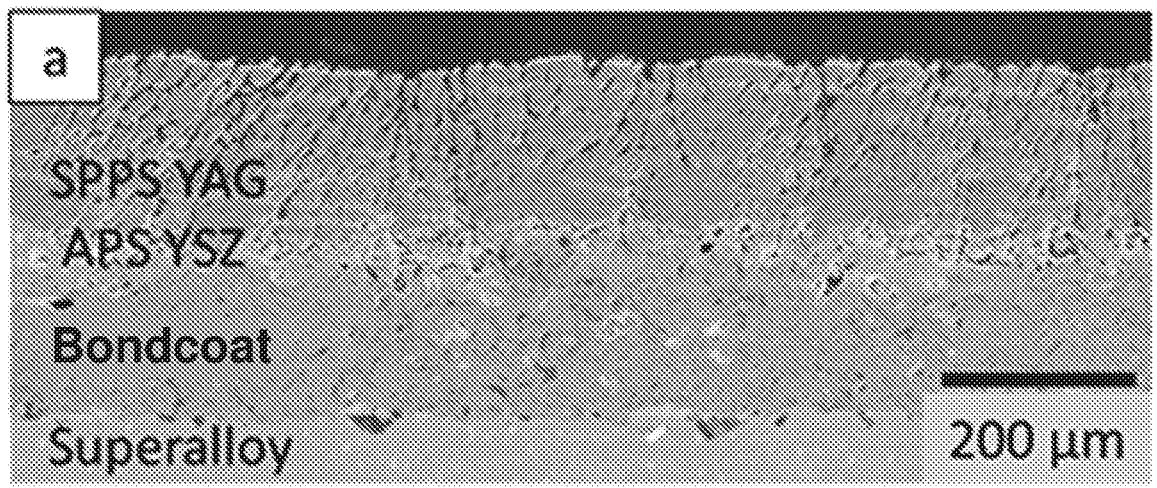
FIG. 1A depicts a cross-sectional image of one embodiment of SPPS YAG without layered porosity on a superalloy coupon with bondcoat and an APS YSZ inner layer.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Thermal barrier coatings (TBCs) are used to protect gas turbine hot section components. At temperatures above approximately 1200° C. melted sand in the form of a glass typically made of calcium magnesium aluminum silicates (CMAS) infiltrates the coating and with sufficient depth of infiltration coating failure is produced.

Currently there are 2 million pounds of the most popular form of TBC materials used in the gas turbine industry. Such coatings allow engines to run hotter and burn fuel more efficiently. The application of coatings described herein may be used for gas turbines. This is potentially a very significant market likely to exceed 100 million dollars.

One way to address this problem is by using a coating (or coatings) that forms a blocking phase which form over time due to elements leaching out of the coatings which changes the CMAS composition and allows it to freeze. For this blocking to work, any through-thickness cracks must be kept to a small width in order that the infiltration is sufficiently slow for the blocking reaction to occur before infiltration gets too deep. Even with this blocking working, the leaching and blocking phase formation is eventually exhausted, and in some cases the speed of formation of the blocking phase is too slow to be successful. Embodiment of the technology described herein allow mitigation in systems currently too slow reacting to successfully block CMAS with standard microstructures because of the infiltration delays the side channels provide along with the added surface area. This is especially yttrium aluminum garnet (YAG) which is relatively un-reactive, but it has other excellent properties including erosion resistance and, in the correct structure, low thermal conductivity at temperature. Microstructures described herein may significantly enhance the performance of known CMAS blocking materials as well.

Embodiments described herein may take many forms. One embodiment involves the deliberate production of thermal barrier coatings with void spaces roughly parallel with the free surface to allow these spaces to channel CMAS laterally, to redirect the CMAS, thus reducing the depth-wise penetration of CMAS into the coating. These channels may be in the size range of 1 micron to 50 microns with most preferred sizes to be 4 to 15 microns. The channels need not be straight nor fully parallel with the free surface but, in some embodiments, at least some of the channels are not connected via vertical channels to the free surface or to the bottom surface of the coating at the substrate interface.

In another embodiment, the channels may be fabricated when deemed advantageous to have as much surface area of coating exposed to the CMAS infiltration in order to accelerate the leading of elements that raise the freeze temperature of the CMAS in the so-called blocking reaction. Such reaction products may include, but are not limited to, those that form Apatite phase or Anorthite phases.

In another embodiment, an increased surface area is included on the free surface to promote a blocking reaction at the free surface.

In another embodiment, the channels (for example, in the above embodiments) may be formed by a solution precursor plasma spray process.

In another embodiment, the channels may be formed by a thermal spray of powders and suspensions.

In another embodiment, the channels may be formed by an electron beam physical vapor deposition process.

In another embodiment, vertical cracks and the approximately free surface parallel channels are disposed at the locations for reactive blocking of CMAS infiltration. This may result from or lead to locating more reactive elements in the vertical cracks and channels. A form of infiltration for YAG and vertical cracks appears in U.S. Patent Publication No. 2016/0257618, which is incorporated herein by reference in its entirety. Reactive elements may include Y, Al, and all the lanthanides. In one embodiment, infiltration of the cracks and channels with reactive materials is achieved by liquid infiltration of liquid chemical precursors, precursors to include but are not limited to salt selected from the group consisting of carboxylate salts, alkoxide salts, carbonate salts, halide salts, nitrate salts, hydrates of the foregoing salts, and combinations thereof. These salts may include, but are not limited to, specifically nitrates, chlorides and acetates and propionates. In another embodiment, the infiltration is achieved by the natural segregation of more reactive phases during solution precursor plasma spray. Some examples include, but are not limited to, the deposition of YAP during solution precursor plasma spray of an yttria rich YAG in which YAP and YAM are likely to form and for which this deposition can be observed.

In another embodiment, the coating in which the channels are to be embedded include all viable thermal barrier coatings. Examples include, but are not limited to, coatings of yttria stabilized zirconia, yttrium aluminum garnet, gadolinium zirconate, multiply doped with rare earth elements zirconates.

Although some embodiments of channels for solution spray may be used for the purpose of reducing heat conduction, the modification or optimization of the geometry of these structures for other purposes may be different tending toward greater channel width, higher channel porosity and finer or higher surface area structures within the channels or as previously called within the inter-pass boundaries (IPBs).

The dramatic beneficial effects of these features on CMAS performance may be demonstrable.

Figure 1B:
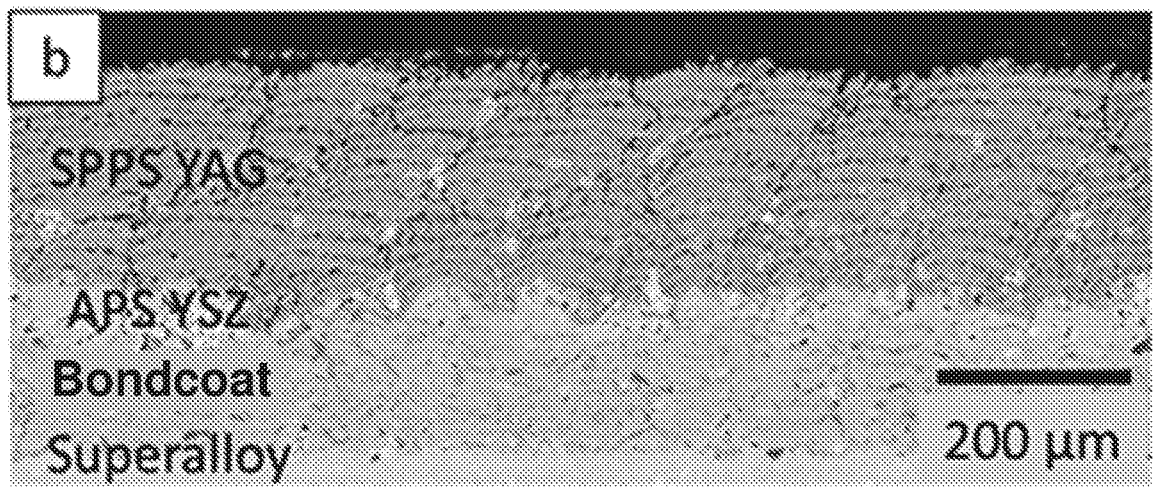
FIG. 1B depicts a cross-sectional image of one embodiment of SPPS YAG with layered porosity on a superalloy coupon with bondcoat and an APS YSZ inner layer.
Figure 2:
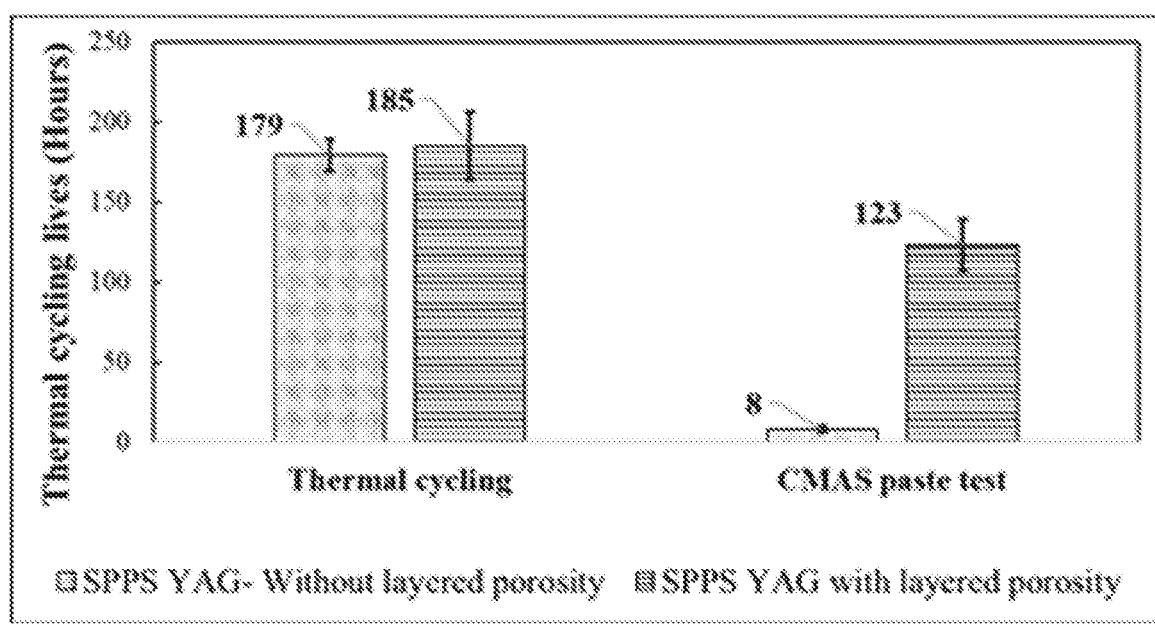
FIG. 2 depicts a graph of thermal cycling lives of embodiments of SPPS YAG coatings with and without CMAS.

In one example, two different microstructures of YAG coatings were made to demonstrate the microstructural effect on CMAS penetration and are shown in FIG. 1. The YAG microstructure shown in (b) has layered porosity and more spacing between the vertical cracks, whereas the microstructure shown in (a) lacks the layered porosity and has a high density of vertical cracks. Coatings with the two microstructures were simultaneously cycled in a furnace (1-hour cycle at 1180° C.) with and without CMAS. The cyclic lives are shown in FIG. 2 where both of the YAG microstructures perform similarly in a thermal cycling without CMAS. However, a drastic difference in cyclic life is observed in the CMAS test. The YAG with layered porosity lasted 66% of its cyclic life without CMAS as compared to the YAG without layered porosity which lasted only 4%.

Thus, the YAG with layered porosity performed approximately fifteen times better than the YAG without layered porosity.

Figure 3:
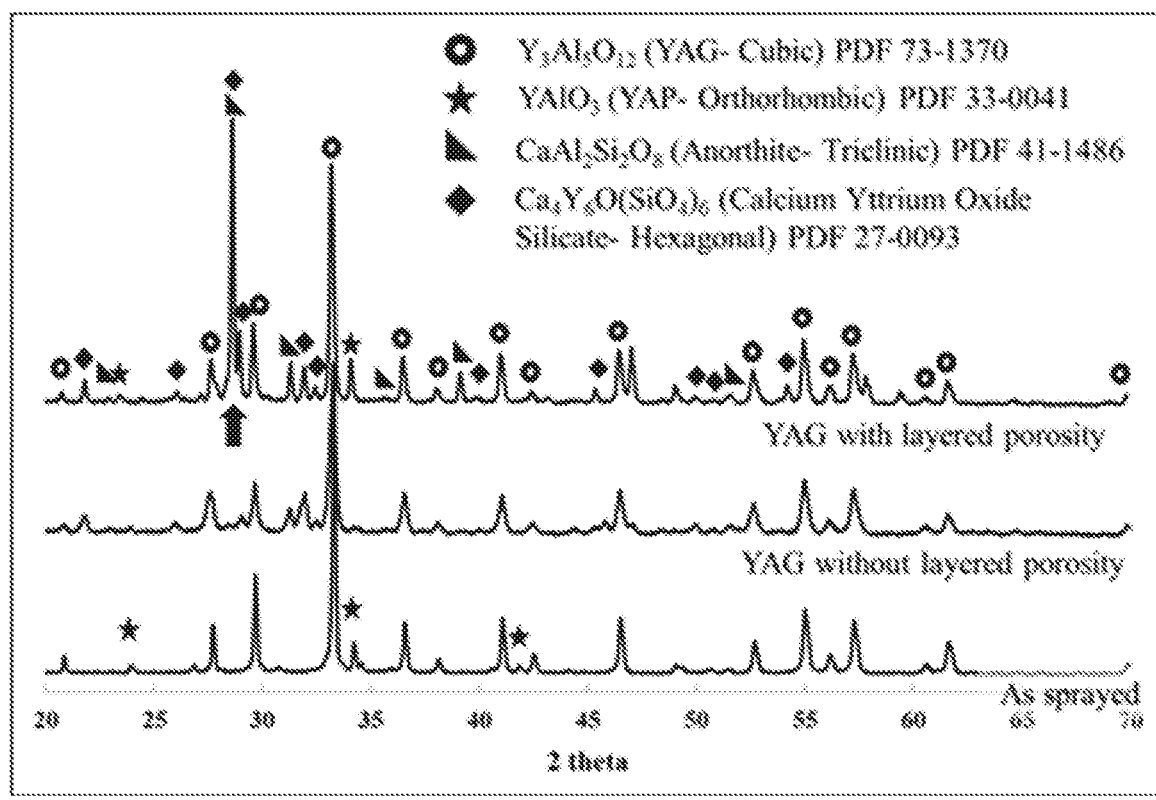
FIG. 3 depicts a graph of XRD patterns of embodiments of TBC surfaces post CMAS paste test.

After the coating's failure, surface x-ray diffraction (XRD) was done on both the sample surfaces to analyze the reaction products. The patterns are shown in FIG. 3 and are benchmarked against "as sprayed" YAG XRD pattern. Clearly, both the YAG coatings show surface reactions with CMAS where the reaction products are yttrium apatite ($Ca_4Y_6O(SiO_4)_6$) and anorthite ($CaAl_2Si_2O_8$), both of which can be shown to block CMAS penetration in other studies. Interestingly, peaks of the two products are stronger in the case of layered porosity coating (the most discernable intensity peak is marked by an arrow) suggesting a stronger reaction. This stronger reaction can be hypothesized to be because of the following two factors. The first factor is about five times larger spacing between the vertical cracks as compared to coating without layered porosity. Microstructures of as sprayed coatings are shown in FIG. 1, where average vertical crack spacing in (a) is 33 µm and in (b) is 168 µm. In some circumstances, the vertical cracks act as channels to CMAS penetration. The second factor is the presence of "feathery" microstructural features on the top surface arising from under penetrated spray. These feathery features may provide higher surface area for reaction between CMAS and YAG.

Figure 4A:
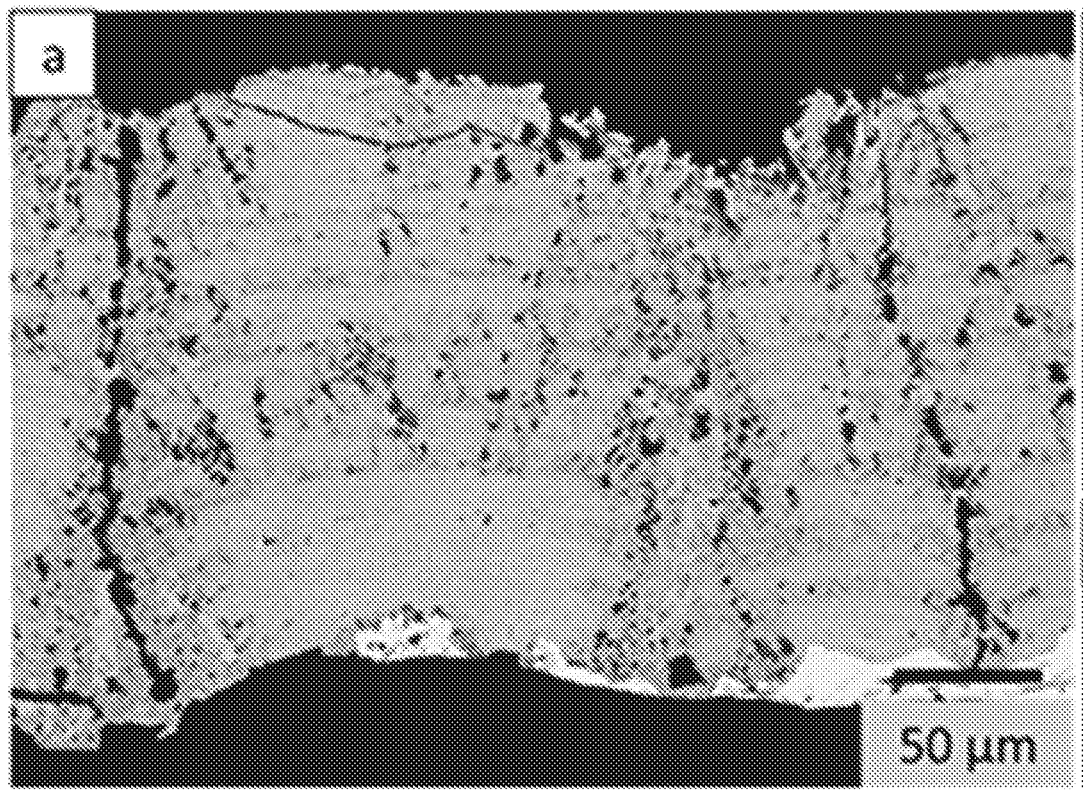
FIG. 4A depicts an image of an embodiment of a failed SPPS YAG interface without a layered porosity coating in a CMAS paste test.
Figure 4B:
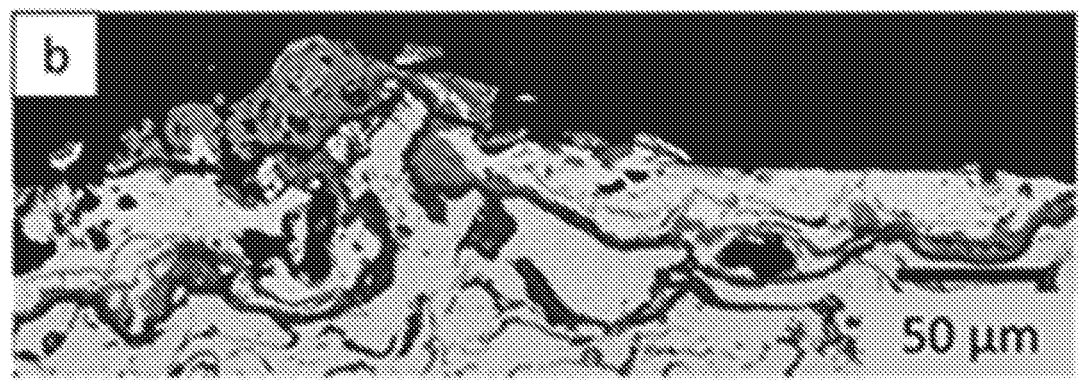
FIG. 4B depicts a backscattered electron (BSE) image of the failed interface of FIG. 4A with a thermally grown oxide (TGO) layer having a thickness of ~4 µm.
Figure 4C:
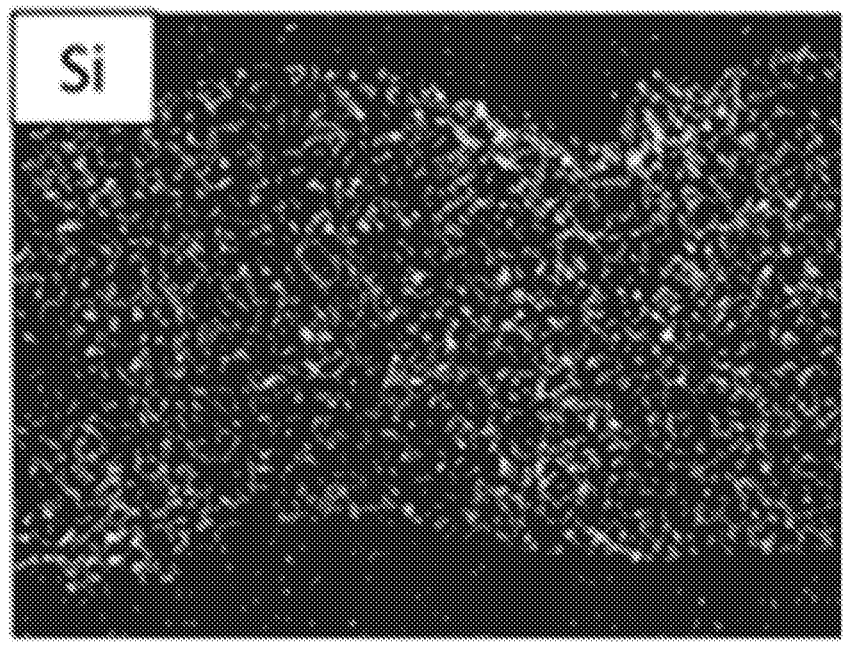
FIG. 4C depicts an EDS map of calcium showing full CMAS infiltration in the coating, primarily through the vertical cracks, of the failed interface of FIG. 4A.
Figure 4D:
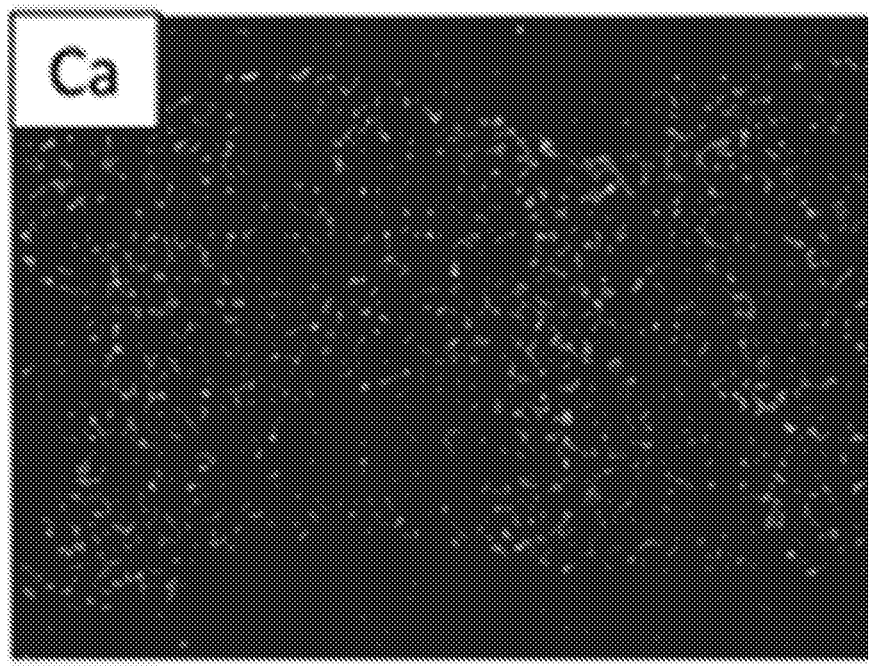
FIG. 4D depicts an EDS map of silicon showing full CMAS infiltration in the coating, primarily through the vertical cracks, of the failed interface of FIG. 4A.

The cross section of the failed SPPS YAG without layered porosity coating is shown in FIG. 4(a) with elemental mapping of calcium and silicon from the CMAS. From the elemental maps, it can clearly be observed that full coating infiltration has happened, and the vertical cracks provide the primary penetration path. FIG. 4(b) shows the failure interface, where fracture is observed in ceramic which is a representative of strain compliance loss in the coating. A thermally grown oxide (TGO) layer of ~4 µm is also observed.

Figure 5A:
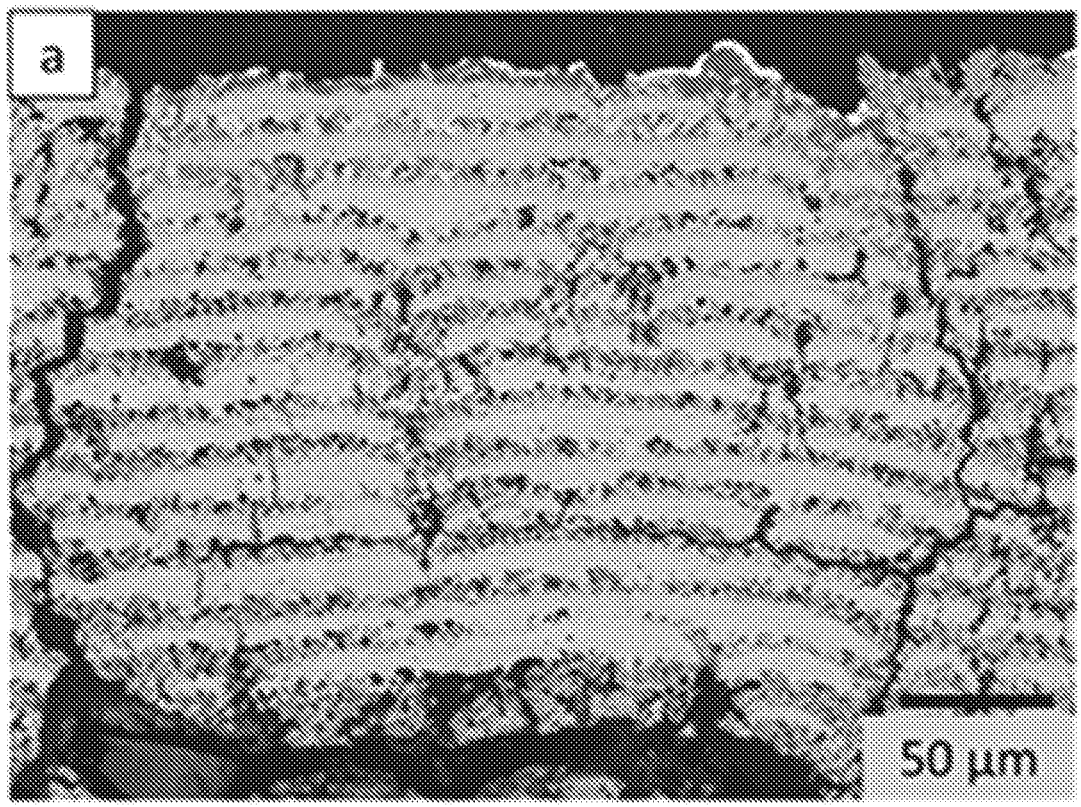
FIG. 5A depicts an image of an embodiment of a failed SPPS YAG interface with a layered porosity coating in a CMAS paste test.
Figure 5B:
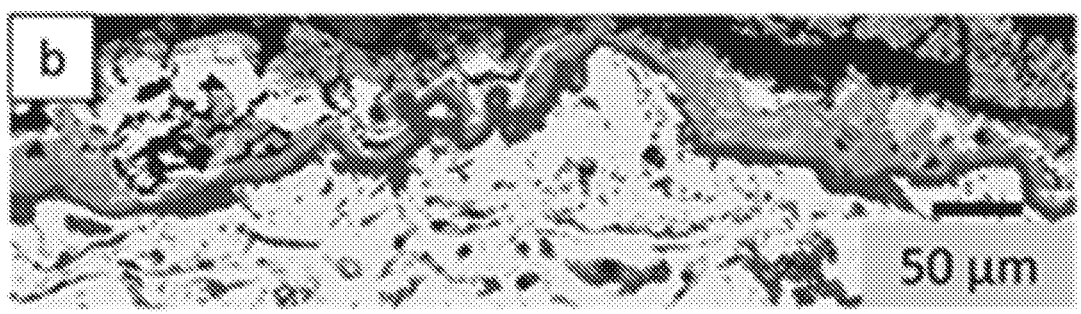
FIG. 5B depicts a backscattered electron (BSE) image of the failed interface of FIG. 5A, with a TGO layer having a thickness of ~8 µm.
Figure 5C:
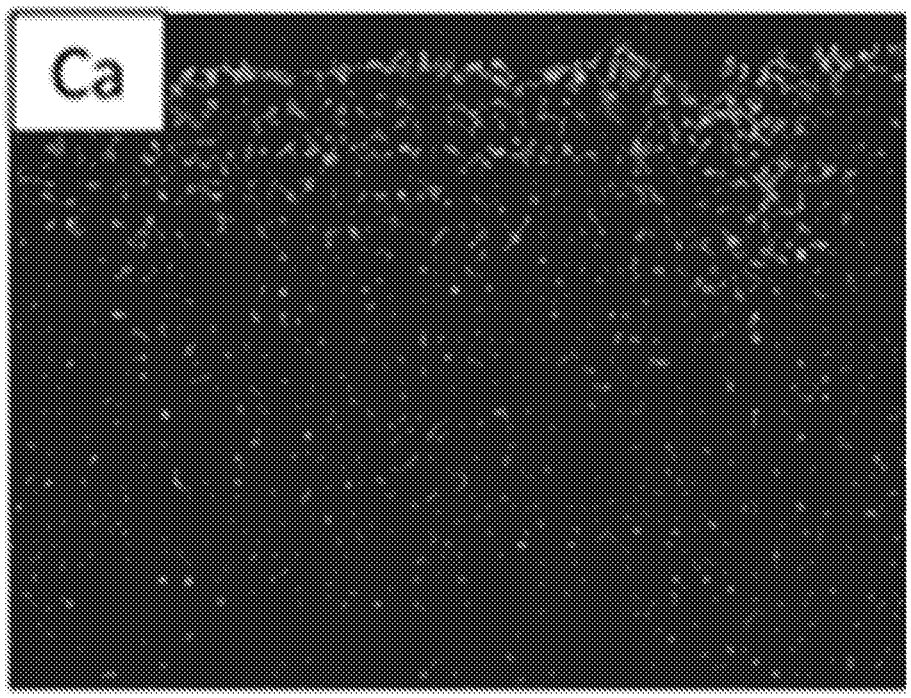
FIG. 5C depicts an EDS map of calcium showing partial (~45 µm) CMAS infiltration in the coating, with horizontal spreading in the porosity, of the failed interface of FIG. 5A.
Figure 5D:
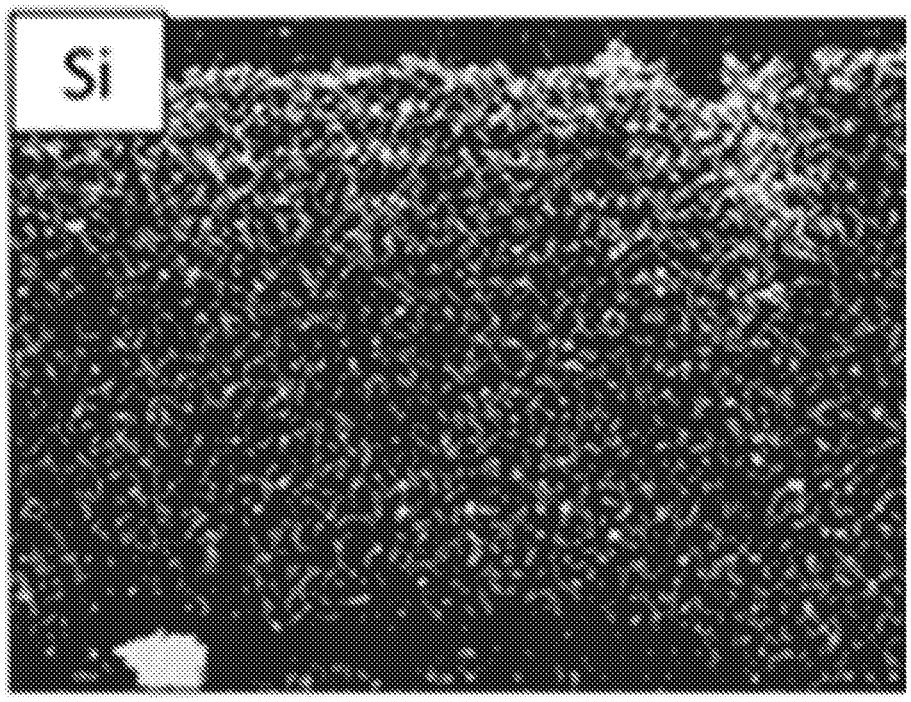
FIG. 5D depicts an EDS map of silicon showing partial (~45 µm) CMAS infiltration in the coating, with horizontal spreading in the porosity, of the failed interface of FIG. 5A.

Post failure, a cross sectional image of YAG with layered porosity is shown in FIG. 5(a). Energy-dispersive x-ray spectroscopy (EDS) maps of calcium and silicon show only partial CMAS penetration (~45 µm) in the coating. However, the CMAS can be observed to be drawn in the top 4 porosity layers from the vertical crack which seems to be acting as the primary source of penetration. The fact that the highest CMAS concentration is seen in the vertical cracks, accompanied by the gradually reducing CMAS concentration from the 1st to the 4th layer, suggests that the horizontal porosity layers are acting as "reservoirs" for CMAS. This, accompanied by stronger surface reaction, seems to be consuming a substantial fraction of CMAS leading to shallower penetration depth. It is also hypothesized that since the horizontal porosity layers are readily available for drawing the CMAS, the vertical cracks remain relatively less penetrated by CMAS thereby preserving the strain tolerance of the coating, resulting in higher thermal cyclic life.

The thickness (7±2 µm) and porosity (71%) of the porosity bands in FIG. 1(a) was calculated, thus the volume of one porosity layer (0.2518 mm$^3$) assuming that it spans parallel to the entire coating surface can be calculated. Also, the volume of CMAS melt applied (1.7018 mm$^3$) can be calculated from the weight and density of individual components. A ratio of CMAS to porosity volume gives the number of the porosity layers needed to fully hold the CMAS. This ratio is ~7 for this particular study, but may vary in other embodiments. From FIG. 5(a) and the calcium map, it is apparent that ~4 porosity layers are filled with CMAS, along with a fraction of CMAS reacted on the surface and in the vertical crack. Thus, the calculation is in reasonable agreement with the experimental data. Such data becomes important because the porosity and thickness of the porous layers can be controlled in a SPPS process and, hence, the CMAS mitigation strategy by controlling the depth of CMAS penetration in the coatings.

Various embodiments may incorporate one or more novel features.

In one embodiment, a coating with lateral flow paths in the microstructure for redirection of CMAS infiltration is implemented.

In another embodiment, the flow paths are deliberately engineered to have high surface area of the coating to accelerate beneficial element leaching into the CMAS.

In another embodiment, a top free surface is deliberately produced with increased surface area for accelerated leaching up to the limits allowed by aero dynamics considerations.

In another embodiment, infiltration of the via vertical cracks the channels with high surface area reactive coating materials using solution or colloidal or suspended material. Such materials may specifically include, but are not necessarily limited to, gadolinium, yttrium and compounds rich in these elements.

In some embodiments, applications of coatings described herein will extend the life of coatings in the presence of CMAS, which inevitably becomes a problem at or slightly below 1200° C. It is for several materials an enabling technology for their use at high temperatures which inevitably involves CMAS.

In some embodiments, at least some of the lateral flow paths, or channels, are generally parallel to the free surface of the thermal barrier coating. This means that the predominant geometric span of the paths or channels are in aligned in the same general direction with the planar or tangential characteristics of the free surface at a point relatively close to the path or channel. Given the natural or imposed deviations of processes used to create the paths or channels, the interior "walls" of the paths or channels may be relatively smooth or rough, and the specific directionality or alignment of the paths or channels may vary over the length of the paths or channels, even though the general directionality of the paths or channels is similar to the free surface of the thermal barrier coatings. Alternatively, the paths or channels may be generally parallel to the interface geometry between the thermal barrier coating and the surface of the coated component.

Although some embodiments described herein incorporate specific physical dimensions or characteristics, other embodiments may have dimensions or characteristics which are approximately similar to those mentioned with reference to a specific embodiment or group of embodiments. In these cases, approximate dimensions may have variations from the specific amounts, quantities, measurements, or other units called out. In some embodiments, variations that differ from the stated values by less than 1% are within an approximate range. In other embodiments, variations that differ from the stated values by about 1-2% are within an approximate range. In other embodiments, variations that differ from the stated values by no more than about 5% are within an approximate range. In other embodiments, variations that differ from the stated values by no more than about 10% are within an approximate range.

In addition to the description herein, this disclosure incorporates the subject matter described and disclosed in the draft manuscript attached in Appendix I.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for forming a thermal barrier coating, the method comprising:
   applying a layer of the thermal barrier coating to a component having a surface; and
   forming a plurality of first channels in the thermal barrier coating, wherein the first channels extend through a thickness of the thermal barrier coating from an interface with the surface of the component and a free surface opposite the interface; and
   forming a plurality of second channels disposed between the free surface and the interface and extending lengthwise generally parallel to the free surface of the thermal barrier coating, wherein the thermal barrier coating comprises a material comprising yttrium aluminum garnet (YAG), wherein the plurality of second channels have an average cross-sectional span in a range of about 1 micron to 50 microns.

2. The method of claim 1, further comprising forming the plurality of second channels to have an average cross-sectional span in a range of about 4 microns to 15 microns.

3. The method of claim 1, further comprising forming the plurality of second channels by a solution precursor plasma spray process.

4. The method of claim 1, further comprising forming the plurality of second channels by a thermal spray of powders and suspensions.

5. The method of claim 1, further comprising forming the plurality of second channels by an electron beam physical vapor deposition process.

6. The method of claim 1, further comprising forming the plurality of first channels and the plurality of second channels at locations for reactive blocking of calcium magnesium aluminum silicates (CMAS) infiltration.

7. The method of claim 1, wherein forming the plurality of first channels further comprises spacing the plurality of first channels about 33 microns to 400 microns apart.

8. The method of claim 1, wherein forming the plurality of second channels further comprises forming openings in at least some of the first channels and connecting some of the second channels to some of the first channels.

9. A method for forming a thermal barrier coating, the method comprising:
   applying a layer of the thermal barrier coating to a component having a surface; and
   forming a plurality of first channels in the thermal barrier coating, wherein the first channels extend through a thickness of the thermal barrier coating from an interface with the surface of the component and a free surface opposite the interface; and
   forming a plurality of second channels disposed between the free surface and the interface and extending lengthwise generally parallel to the free surface of the thermal barrier coating, wherein the thermal barrier coating comprises a material comprising yttria stabilized zirconia (YSZ).

10. The method of claim 9, wherein the material comprises yttria stabilized zirconia (YSZ).

11. The method of claim 9, further comprising forming the plurality of second channels to have an average cross-sectional span in a range of about 1 micron to 50 microns.

12. The method of claim 9, further comprising forming the plurality of second channels to have an average cross-sectional span in a range of about 4 microns to 15 microns.

13. The method of claim 9, further comprising forming the plurality of second channels by a solution precursor plasma spray process.

14. The method of claim 9, further comprising forming the plurality of second channels by a thermal spray of powders and suspensions.

15. The method of claim 9, further comprising forming the plurality of second channels by an electron beam physical vapor deposition process.

16. The method of claim 9, further comprising forming the plurality of first channels and the plurality of second channels at locations for reactive blocking of calcium magnesium aluminum silicates (CMAS) infiltration.

17. The method of claim 9, wherein forming the plurality of first channels further comprises forming openings in the free surface of the thermal barrier coating.

18. The method of claim 9, wherein forming the plurality of second channels further comprises forming openings in at least some of the first channels and connecting some of the second channels to some of the first channels.

19. A method for forming a thermal barrier coating, the method comprising:
   applying a layer of the thermal barrier coating to a component having a surface; and
   forming a plurality of first channels in the thermal barrier coating, wherein the first channels extend through a thickness of the thermal barrier coating from an interface with the surface of the component and a free surface opposite the interface; and
   forming a plurality of second channels by a thermal spray of powders and suspensions, the plurality of second channels disposed between the free surface and the interface and extending lengthwise generally parallel to the free surface of the thermal barrier coating, wherein the thermal barrier coating comprises a material comprising yttrium aluminum garnet (YAG).

* * * * *